(12) United States Patent
Karve et al.

(10) Patent No.: US 7,749,829 B2
(45) Date of Patent: Jul. 6, 2010

(54) STEP HEIGHT REDUCTION BETWEEN SOI AND EPI FOR DSO AND BOS INTEGRATION

(75) Inventors: Gauri V. Karve, Austin, TX (US);
Debby Eades, Manor, TX (US);
Gregory S. Spencer, Pflugerville, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 291 days.

(21) Appl. No.: 11/742,755

(22) Filed: May 1, 2007

(65) Prior Publication Data

US 2008/0274594 A1 Nov. 6, 2008

(51) Int. Cl.
*H01L 21/336* (2006.01)

(52) U.S. Cl. ............... 438/198; 438/222; 438/404; 438/481; 257/E21.6

(58) Field of Classification Search ......... 438/198, 438/222, 424, 481; 257/E21.6
See application file for complete search history.

(56) References Cited

U.S. PATENT DOCUMENTS 5,970,362 A  10/1999  Lyons et al. ............. 438/424
6,777,307 B1  8/2004  Ramkumar et al. ....... 438/424
6,825,534 B2  11/2004  Chen et al. .............. 257/354
2006/0049460 A1  3/2006  Chen et al. .............. 257/347

FOREIGN PATENT DOCUMENTS

EP  639858 A2  2/1995
EP  639858 A3  2/1995
WO  WO 2004/11440  12/2004
WO  WO 2006/053890  5/2006

OTHER PUBLICATIONS

M. Yang et al., "High performance CMOS fabricated on hybrid substrate with different crystal orientations," IEEE 2003.*

* cited by examiner

*Primary Examiner*—Jack Chen
(74) *Attorney, Agent, or Firm*—Hamilton & Terrile, LLP; Michael Rocco Cannatti (57) ABSTRACT

A semiconductor process and apparatus provides a planarized hybrid substrate (16) by removing a nitride mask layer (96) and using an oxide polish stop layer (92) when an epitaxial semiconductor layer (99) is being polished for DSO and BOS integrations. To this end, an initial SOI wafer semiconductor stack (11) is formed which includes one or more oxide polish stop layers (91, 92) formed between the SOI semiconductor layer (90) and a nitride mask layer (93). The oxide polish stop layer (92) may be formed by depositing a densified LPCVD layer of TEOS to a thickness of approximately 100-250 Angstroms.

22 Claims, 7 Drawing Sheets

STEP HEIGHT REDUCTION BETWEEN SOI AND EPI FOR DSO AND BOS INTEGRATION

BACKGROUND OF THE INVENTION

1. Field of the Invention

The present invention is directed in general to the field of semiconductor devices. In one aspect, the present invention relates to complementary metal oxide semiconductor (CMOS) field effect transistors (FETs) fabricated on hybrid substrates.

2. Description of the Related Art

Figure 1:
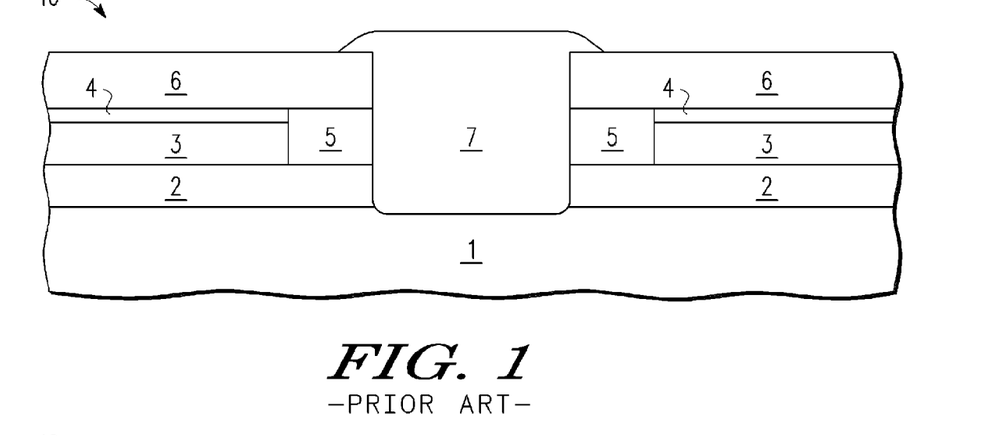
FIG. 1 is a partial cross-sectional view of a conventionally formed dual surface orientation wafer structure after formation of a selective epitaxial semiconductor layer.
Figure 2:
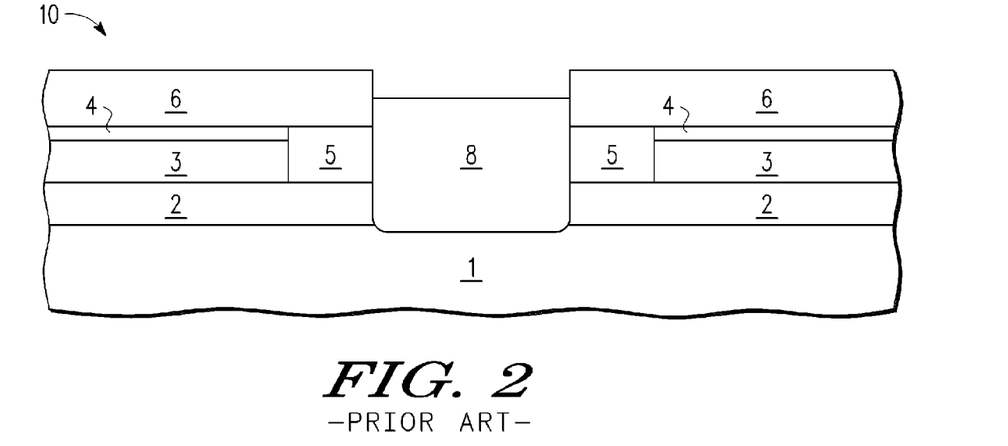
FIG. 2 illustrates processing subsequent to FIG. 1 after polishing of the epi semiconductor layer.
Figure 3:
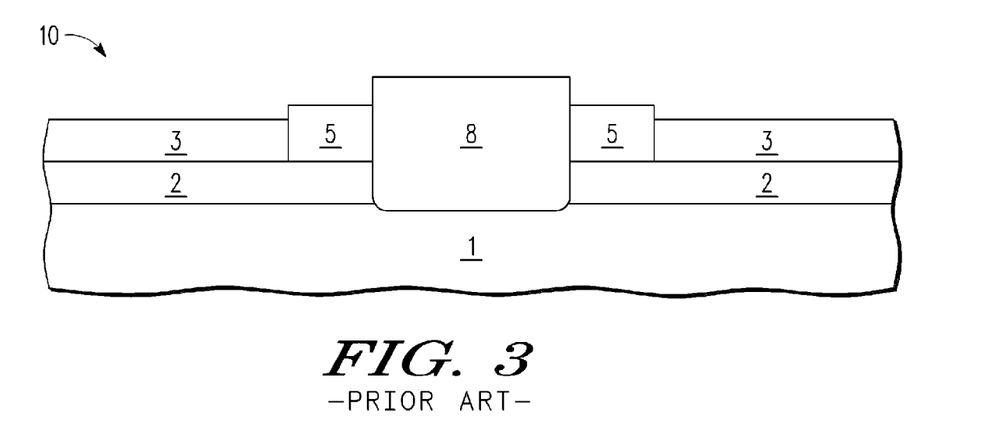
FIG. 3 illustrates processing subsequent to FIG. 2 after a nitride layer is stripped, leaving two surfaces having non-uniform heights.

To address the difference in electron and hole mobility values for NMOS and PMOS transistor devices formed on semiconductor wafers having a single crystal orientation, CMOS devices are increasingly fabricated with hybrid substrates with different surface orientations using semiconductor-on-insulator (SOI) wafer bonding to provide PMOS and NMOS devices with their own optimized crystal orientation. Examples of hybrid substrates include Dual Substrate Orientation (DSO). Such hybrid substrates provide PMOS and NMOS devices with their own optimized crystal orientation. In addition, while some devices exhibit performance improvement from being fabricated on SOI substrates, others benefit from being fabricated on bulk substrates. In order to provide benefit to both device types, Bulk on SOI (BOS) integrations where bulk regions are formed in semiconductor-on-insulator (SOI) substrates are desired. Prior attempts to integrate DSO or BOS substrates have used epitaxial growth to form one of the crystal surface orientations, but have resulted in non-uniform silicon step/recess heights between the different crystal surfaces after the grown epitaxial material is polished with a chemical mechanical polish (CMP) step. The different surface heights are caused by pattern density effects and the CMP dishing sensitivity of structures of varying sizes and structure density which create variations in post-CMP uniformity. Another source of surface height difference is the presence of a nitride polish stop layer used during the shallow trench isolation (STI) and CMP processing steps. An example is depicted in FIGS. 1-3 which show a device 10 having two crystal surface orientations—surface 1 having a first orientation and a semiconductor-on-insulator (SOI) layer 3 having a second orientation. The SOI layer 3 is separated from the underlying substrate layer 1 by buried oxide layers 2 and isolation regions 5, and is covered by pad oxide layer 4 and nitride layers 6. Because the nitride layer 6 is used as an anti-reflective coating (ARC) and as a hardmask for the active etch process used to etch through the buried oxide layer 2, the nitride layer 6 has a certain minimum thickness which results in relatively large step heights between the finally formed SOI layer 3 and epi layer 7. In particular, the patterned nitride layer 6 is used to etch an opening in the device 10 in which an epitaxial silicon layer 7 (having the first orientation) is formed. After the epitaxial silicon 8 is polished (as depicted in FIG. 2), the surface of the epitaxial silicon 8 is recessed below the nitride layer 6. However, when the pad oxide layer 4 and nitride layer 6 are stripped (as depicted in FIG. 3), the epitaxial silicon 8 is typically higher than the underlying SOI layer 3. The non-uniform surface heights impair photolithography control and increase dispersion of device parametrics and performance, especially when the sizes and density of the device structures vary.

Accordingly, a need exists for a semiconductor manufacturing process which improves the post-CMP planarity of the dual surface orientation devices. In addition, there is a need for a semiconductor fabrication process which provides better photo control by reducing the post-CMP silicon step/recess height differences. There is also a need for a fabrication process which avoids the process and performance limitations associated with non-uniform surface heights and minimizes surface step heights in a Dual-Surface Orientation (DSO) or Bulk-on-Silicon (BOS) integration. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS devices with hybrid substrates by removing a nitride mask layer and using an oxide polish stop layer when an epitaxial semiconductor layer is being polished for DSO and BOS integrations. As a preliminary matter, an initial SOI wafer semiconductor stack is formed which includes one or more oxide polish stop layers formed between the SOI semiconductor layer and a nitride mask layer. In various embodiments, the oxide polish stop layer is formed by depositing a densified LPCVD layer of TEOS to a thickness of approximately 100-250 Angstroms, though other types and thickness of oxide materials may be used. Either before or after the STI regions are formed, a trench opening is formed in the SOI wafer semiconductor stack using a patterned nitride mask layer to expose the underlying substrate layer, and an epitaxial semiconductor substrate layer is grown in the trench opening. After removing the patterned nitride mask layer to reveal the oxide polish stop layer, the epitaxial semiconductor substrate layer is polished down using the oxide polish stop layer, thereby reducing the surface semiconductor step height in the finally formed device. Thus, integration of DSO and BOS substrates is promoted by using an oxide polish stop layer instead of a nitride mask layer as the semiconductor polish stop so that the resulting structure can be substantially planarized with a CMP process to form hybrid substrates on which semiconductor devices may be fabricated.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 4:
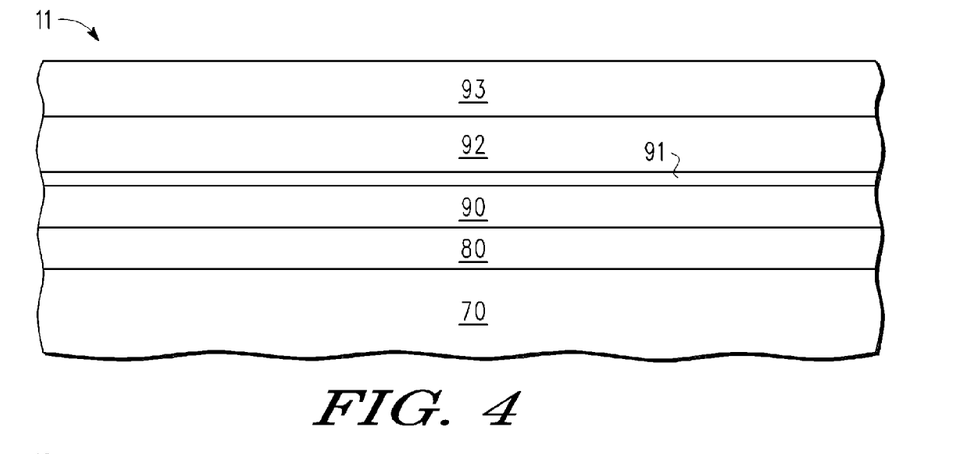
FIG. 4 is a partial cross-sectional view of a semiconductor wafer structure having SOI layers formed over a semiconductor substrate where an oxide polish stop layer and a first nitride mask layer are formed over the SOI semiconductor layer.

Turning now to FIG. 4, a partial cross-sectional view is illustrated of a semiconductor wafer structure 11 having semiconductor-on-insulator (SOI) layers 90, 80, respectively, located over a semiconductor substrate layer 70 where one or more oxide polish stop layers 91, 92 and a nitride mask layer 93 are formed over the SOI semiconductor layer 90. Specifically, the structure 11 includes a first semiconductor layer 70 formed of a semiconductor material that has a first crystallographic orientation. Depending on the type of transistor device being fabricated, the first semiconductor layer 70 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor layer 70 may be appropriately doped to provided n-type (electron) and p-type (hole) carriers.

In the SOI layers, the structure 11 includes an insulator layer 80 located on the first semiconductor layer 70. Layer 80 will be ultimately be used to form the isolation layer for semiconductor-on-insulator devices. In addition, the SOI layers include a second semiconductor layer 90 formed of a semiconductor material which has a second crystallographic orientation which may be different from the first crystallographic orientation, though the first and second crystallographic orientations can also be the same. Depending on the type of transistor device being fabricated, the second semiconductor layer 90 may be formed from any semiconductor material, including, for example, Si, SiC, SiGe, SiGeC, Ge, GaAs, InAs, InP as well as other III-V or II-VI compound semiconductors or any combination thereof. It will also be appreciated that the second semiconductor layer 90 may be appropriately doped to provided n-type (electron) and p-type (hole) carriers. The crystallographic orientation of the second semiconductor layer 90 may be (100), (111), or (110), and may be selected so that it is different from the crystallographic orientation of the first semiconductor layer 70 in the case of DSO integrations. The crystal orientations of the first semiconductor layer 70 and the second semiconductor layer 90 will depend on the materials used to form the wafer structure 11. For example, when silicon is employed as the semiconductor material, electron mobility is higher on a (100) surface orientation, and hole mobility is higher on a (110) surface orientation provided that the channel direction is oriented in the <110> direction. In this case, the (100) Si surface is used as the substrate layer when forming bulk NMOS devices, while the (110) Si surface is used as the substrate layer when forming bulk PMOS devices.

Formed over the second or SOI semiconductor layer 90 is a first relatively thin oxide layer 91. In various embodiments, the oxide layer 91 is formed to a thickness of approximately 90 Angstroms, though any desired thickness may be used. The first oxide layer 91 may be formed by thermally growing an oxide material (such as silicon dioxide, nitrided silicon oxide, metal oxide or multi-metal oxide) on the SOI semiconductor layer 90, though any desired technique may be used, such as chemical vapor deposition (CVD) techniques, physical vapor deposition (PVD) techniques, atomic layer deposition (ALD) techniques, or any other technique for depositing or growing an oxide layer 91.

After forming the first oxide layer 91, a second relatively thicker oxide layer 92 is formed to a predetermined thickness that is selected to provide a polish stop property for the layer 92. In various embodiments, the second oxide layer 92 is formed to a thickness of approximately 100-300 Angstroms, and more preferably approximately 190-210 Angstroms, though any desired thickness may be used. The second oxide layer 92 may be formed by using a low pressure chemical vapor deposition (LPCVD) process to deposit a layer of tetraethyl ortho-silicate (TEOS) or some other conformal oxide layer over the first oxide layer 91, which is then densified with a heating or anneal step. However, it will be appreciated that the second oxide layer 92 may be formed using any desired technique, such as chemical vapor deposition (CVD) techniques (such as plasma-enhanced CVD (PECVD)), physical vapor deposition (PVD) techniques, atomic layer deposition (ALD) techniques, or any other technique for depositing an oxide layer 92. Alternatively, the first oxide layer 91 may be thermally grown from the SOI semiconductor layer 90 to the predetermined thickness that provides the required polish stop function or property, thereby eliminating the need to deposit a second oxide layer 92. While an oxide material may be used to form the polish stop layer 92, it will be appreciated that any appropriate polish stop material may be used to form the polish stop layer 92, provided that the etch properties of the polish stop material used to form the layer 92 allow for the upper hardmask layer 93 (described below) to be selectively removed while leaving substantially intact the underlying polish stop layer 92 and that layer 92 serves as a reliable polish stop layer. As will be appreciated, an appropriate polish stop material is a material that will provide good CMP selectivity with respect to the semiconductor material being polished, that will not increase post-CMP defectivity, and that is relatively easy to remove after the CMP step.

The top of the semiconductor wafer structure 11 includes a hardmask layer 93 formed over the underlying oxide layer(s) 91, 92 with an appropriate masking materials, such as nitride. As illustrated, the hardmask layer 93 is formed to a predetermined thickness that is selected to provide a photo etch protection property for any subsequent photo etch processes that are used to form any trench opening(s) in the wafer structure 11. In various embodiments, the nitride hardmask layer 93 is formed to a thickness of between approximately 800-2500 Angstroms, and more preferably approximately 900-1200 Angstroms, and while any desired thickness may be used, step height reduction in the final product is improved by making the nitride hardmask layer 93 thinner. The nitride hardmask layer 93 may be formed by depositing a layer of silicon nitride or some other appropriate photo etch masking material using any desired technique, such as PECVD, CVD, PVD, ALD, or the like.

Figure 5:
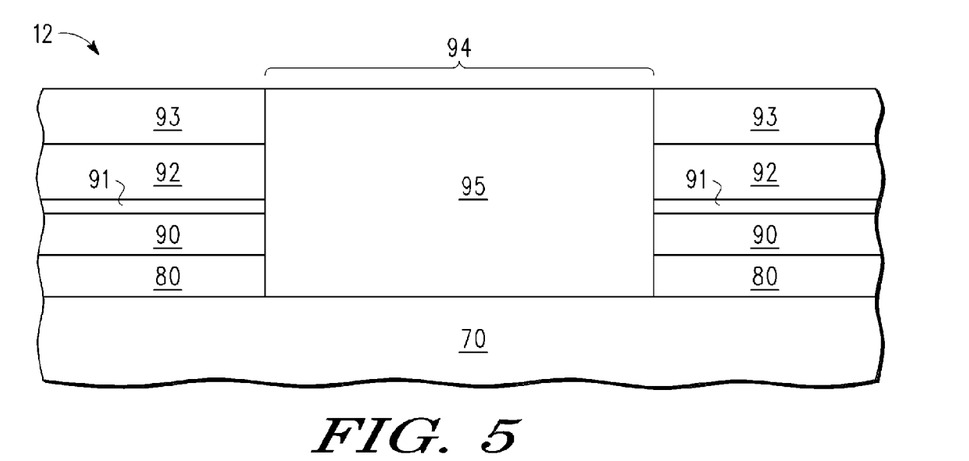
FIG. 5 illustrates processing subsequent to FIG. 4 where a shallow trench isolation region is formed by filling a first trench opening with a polished insulator material.

FIG. 5 illustrates processing of a semiconductor wafer structure 12 subsequent to FIG. 4 where a shallow trench isolation region 95 is formed by filling a first trench opening 94 with a polished insulator material. As will be appreciated, any desired patterning and anisotropic etching techniques may be used to form an opening 94, such as patterning the nitride hardmask layer 93 using a mask layer (not shown), and then using the patterned nitride hardmask layer 93 to selectively remove or etch the exposed portions of the underlying oxide layers 91, 92 and semiconductor-on-insulator (SOI) layers 80, 90. While the trench opening 94 is shown as being formed down to the underlying substrate, it will be appreciated that the etch process used to form the trench opening 94 may etch down to only the insulator layer 80. Once the trench opening 94 is formed, the opening 94 is filled with a deposited dielectric (such as high density plasma oxide), and then polished, etched or otherwise planarized to form the shallow trench isolation region 95.

Figure 6:
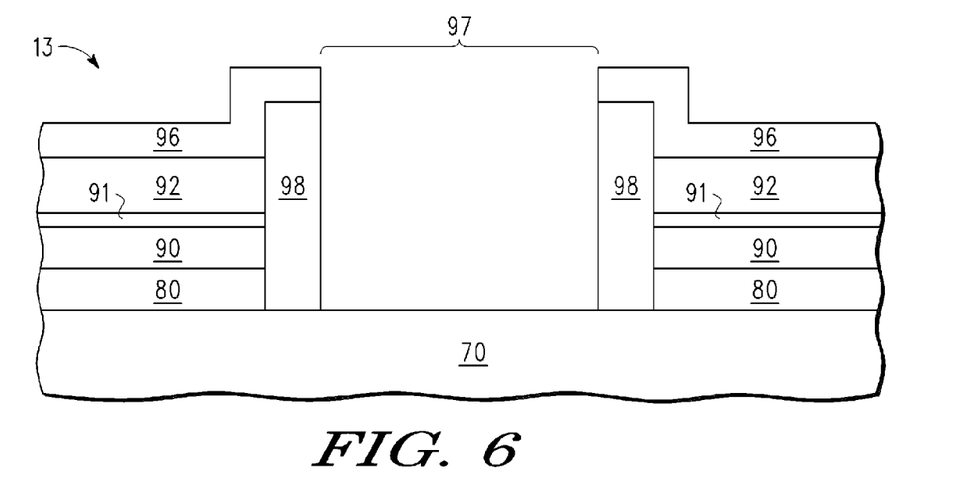
FIG. 6 illustrates processing subsequent to FIG. 5 after the first nitride mask layer is stripped and a second patterned mask layer is used to form a second trench opening in the shallow trench isolation region to expose a portion of the underlying substrate.

FIG. 6 illustrates processing of a semiconductor wafer structure 13 subsequent to FIG. 5 after the first nitride mask layer 93 is stripped or removed and a second patterned nitride mask layer 96 is used to form a second trench opening 97 in the shallow trench isolation region 95 to expose a portion of the underlying substrate. As a preliminary step, the first nitride mask layer 93 may be removed using any desired silicon nitride etch chemistry, such as a hot phosphoric acid ($H_3PO_4$) solution. Once the first nitride mask layer 93 is removed, the second nitride hardmask layer 96 is formed by depositing a layer of silicon nitride or some other appropriate photo etch masking material using any desired technique, such as PECVD, CVD, PVD, ALD, or the like. The second nitride hardmask layer 96 may be deposited to a thickness of between approximately 800-2500 Angstroms, and more preferably approximately 900-1100 Angstroms. While the first nitride mask layer 93 may be stripped and replaced, it will be appreciated that the second patterned mask layer 96 may also be formed by depositing a layer of silicon nitride or other mask layer material over the patterned first nitride mask layer 93. However formed, the second nitride mask layer 96 is patterned and used to form the second trench opening 97 using any desired selective etch technique, such as patterning the nitride hardmask layer 96 using a mask layer (not shown), and then using the patterned nitride hardmask layer 96 to selectively remove or etch the exposed portions of the underlying shallow trench isolation region 95 down to the underlying substrate 70. Where the second trench opening 97 is smaller than, and co-located within, the first trench opening 94, portions of the shallow trench isolation region 95 which are not etched are used to form the shallow trench isolation (STI) regions 98 in the finally formed device. The opening 97 is used to define and differentiate active regions for first and second types of MOS devices subsequently formed on the wafer structure 13. For example, the unetched portions of the second semiconductor layer 90 define a first device region for a first type of MOS device, while the portions of the first semiconductor layer 70 that is exposed by the opening 97 (and that is subsequently epitaxially formed, as described hereinbelow) defines a second device region for a second type of MOS device.

Figure 7:
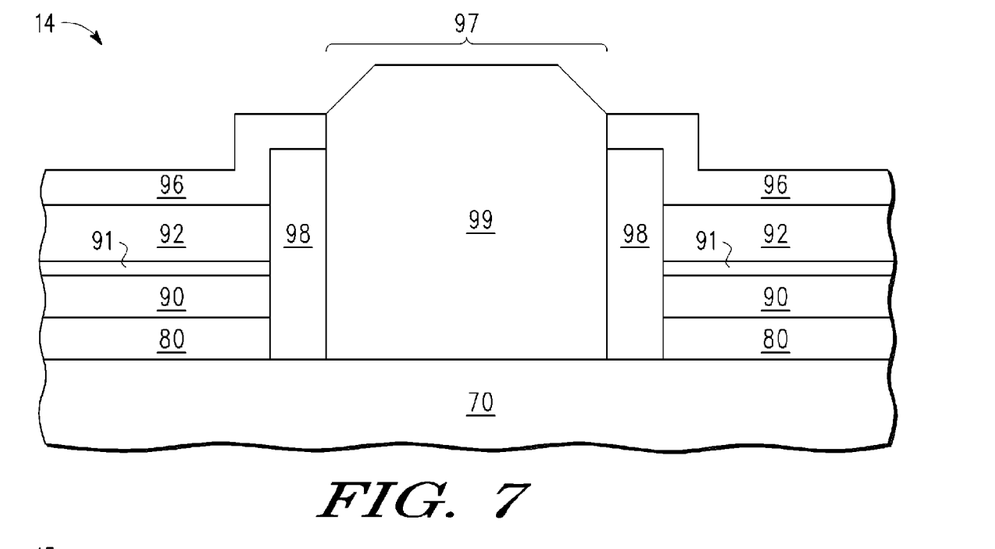
FIG. 7 illustrates processing subsequent to FIG. 6 after an epitaxial semiconductor layer is selectively formed to partially or completely fill the second trench opening.

Turning now to FIG. 7, processing of a semiconductor wafer structure 14 subsequent to FIG. 6 is illustrated after an epitaxial semiconductor layer 99 is selectively formed to partially or completely fill the second trench opening 97 so that it is higher than the second semiconductor layer 90 and the oxide polish stop layer 92, if not also the second nitride mask layer 96. At a minimum, the epitaxial growth process is controlled so that all of the second trench openings 97 on the wafer structure, no matter their size, are at least filled with epitaxial semiconductor material. As described herein and understood by those skilled in the art, the process of forming an epitaxial layer may be described as either depositing or growing a layer so that the "growth" and "deposition" terms are used interchangeably with respect to epitaxial formation. By selectively forming the epitaxial semiconductor layer 99 so that its crystallographic orientation is different from the crystallographic orientation of the second semiconductor layer 90, the mobility of the holes and electrons for subsequently formed PMOS and NMOS devices, respectively, may be optimized. Since the regrown semiconductor layer 99 is epitaxially grown from the first semiconductor layer 70, they will have the same crystallographic orientations, though the layers 70, 99 can be formed of different semiconductor materials. Depending on the type of transistor device being fabricated, the epitaxial semiconductor layer 99 may be formed from any (doped or undoped) semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility. For example, if PMOS devices are formed over the epitaxial semiconductor layer 99, the epitaxial semiconductor layer 99 may be formed by epitaxially growing silicon having a crystallographic orientation (e.g., (110)) that is the same as the crystallographic orientation of the first semiconductor layer 70. This epitaxial growth may be achieved by heating the semiconductor wafer structure 14 to a temperature between 500 and 900° C. in the presence of dichlorosilane, HCL and hydrogen gas. Alternatively, if NMOS devices are formed over the epitaxial semiconductor layer 99, at least a portion of the epitaxially grown layer 99 may be formed by epitaxially growing silicon having a (100) crystallographic orientation. In this case, the second semiconductor layer 90 would have a (110) crystallographic orientation, and the PMOS device would be built on this layer. By optimizing the crystallographic orientations of the layers 90, 99 (e.g., so that the epitaxially grown layer 99, or "epi-layer," is formed of (110) semiconductor material and the second semiconductor layer 90 is formed of (100) semiconductor material), significant mobility improvements are obtained over single-orientation substrates - up to 2.5× improvement for hole mobility in PMOS devices formed on (110) Si compared to (100) Si when formed over silicon dioxide gate layers. In addition, by completely filling the trench opening 97 with an epitaxial semiconductor layer 99 that grows above and over the nitride mask layer 96, crystalline defectivity in the trench opening 97 is reduced or minimized. It will be appreciated that, when the epi layer 99 is formed with n-type material, the second semiconductor layer 90 in the SOI region may be formed of depositing strained p-type semiconductor material having a second crystal orientation that is different from the first crystal orientation. However, the crystal orientations of the semiconductor layers 70 and 90 may be the same.

Figure 8:
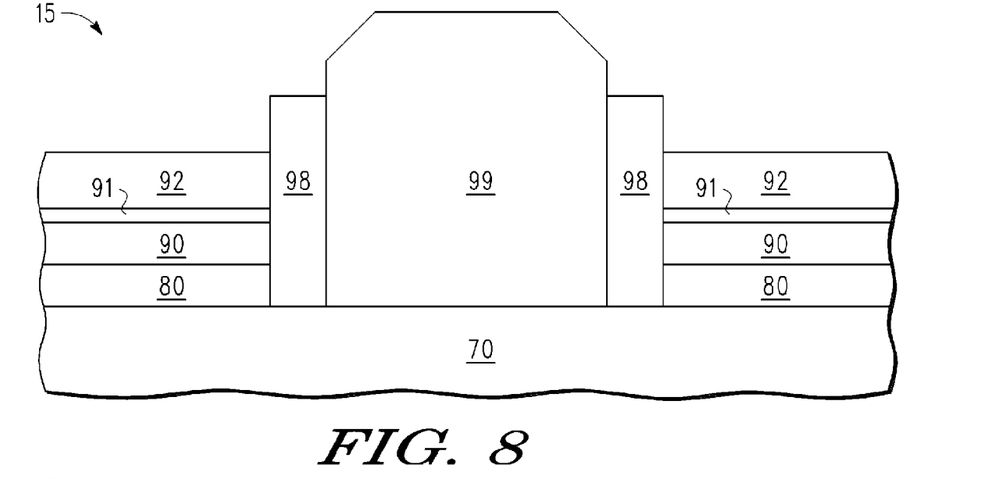
FIG. 8 illustrates processing subsequent to FIG. 7 after the second patterned mask layer is removed.

FIG. 8 illustrates processing of a semiconductor wafer structure 15 subsequent to FIG. 7 after the second patterned mask layer 96 is removed. In selected embodiments, the second patterned mask layer 96 is completely removed using any desired silicon nitride etch chemistry, such as a hot phosphoric acid ($H_3PO_4$) solution. Once the second patterned mask layer 96 is removed, the underlying oxide layer 92 is exposed for use as a polish stop layer during silicon polishing of the wafer structure.

Figure 9:
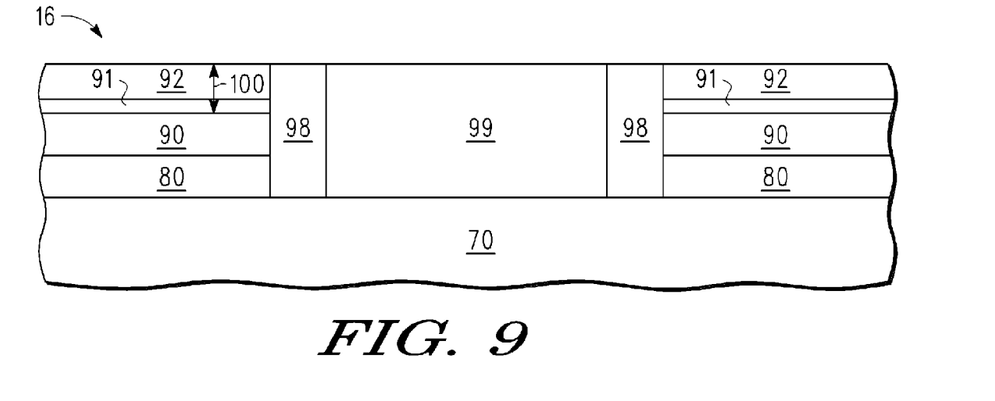
FIG. 9 illustrates processing subsequent to FIG. 8 after a polish of the epitaxial semiconductor layer.

This is illustrated in FIG. 9, which depicts processing of a semiconductor wafer structure 16 subsequent to FIG. 8 after a polish and/or etch of the epitaxial semiconductor layer 99. Chemical mechanical polishing or any desired etchant process may be used to polish epi semiconductor layer 99, including dry etching, wet etching or oxidation of silicon and then stripping away the oxide. For example, after stripping the second patterned mask layer 96, a silicon CMP process may be applied to planarize the epitaxial semiconductor layer 99 using the oxide layer 92 as a CMP polish stop layer. During the CMP polish process, all or part of the polish stop layer 92 may be removed. Once the CMP polish is complete, the wafer structure 16 may be cleaned with a hot phosphoric acid ($H_3PO_4$) solution, and then a second touch-up CMP polish may be applied to buff the epi semiconductor layer 99. As illustrated, the upper surface of the polished epi semiconductor layer 99 is higher than the underlying SOI layer 90 by a step height 100 which is exaggerated in FIG. 9. In this way, reduced step heights of less than approximately 200 Angstroms are obtained, though smaller step heights may be obtained by reducing the thickness of the oxide polish stop layer 92. In accordance with various embodiments, the step height between the polished epi semiconductor layer 99 and the underlying SOI layer 90 is nearly zero. The resulting dual substrate structure 16 has a substantially coplanar surface to facilitate CMOS processing.

It will also be appreciated that other semiconductor processing sequences may be used to fabricate hybrid substrates having substantially uniform dual substrate surface heights by using an oxide CMP stop layer for polishing an epitaxially grown semiconductor layer. For example, while the epi semiconductor layer may be polished using an oxide CMP stop layer after formation of the STI regions, such as described above, the epi polish step may also be performed before the STI regions are formed while still obtaining substantially planar dual surface orientation areas.

Figure 10:
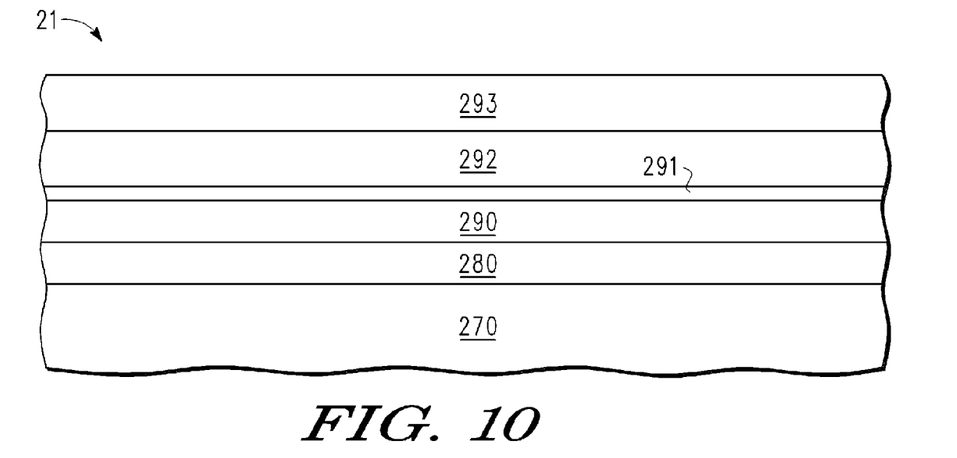
FIG. 10 is a partial cross-sectional view of a semiconductor wafer structure having SOI layers formed over a semiconductor substrate where an oxide polish stop layer and first nitride mask layer are formed over the SOI semiconductor layer.

An example of such an alternative processing sequence is depicted beginning with FIG. 10 which illustrates a partial cross-sectional view of a semiconductor wafer structure 21 having silicon on insulator layers 290, 280 formed over a semiconductor substrate 270 where an oxide polish stop layer 292 and first nitride mask layer 293 are formed over the SOI semiconductor layer 290. As depicted in FIG. 10, the SOI layers include an insulator layer 280, also known as buried oxide (BOX) layer, which is formed (e.g., by depositing a dielectric layer, such as oxide) on the first semiconductor substrate layer 270 and which will ultimately be used to form the isolation layer for silicon-on-insulator devices. The SOI layers also include a second semiconductor layer 290 formed of a semiconductor material which may have a crystallographic orientation which is different from the crystallographic orientation of the first semiconductor substrate layer 270, though the crystallographic orientations can also be the same. The wafer structure 21 also includes a first relatively thin oxide layer 291 which may be formed as a sacrificial or pad oxide layer by thermally growing an oxide layer on the SOI semiconductor layer 290 to a thickness of approximately 90 Angstroms, though any desired thickness may be used. Oxide layer 291 is used to protect the surface of SOI layer 290 from various processing steps since devices are formed on layer 290. After forming the first relatively thin oxide layer 291, a second relatively thicker oxide layer 292 is formed to a predetermined thickness that is selected to provide a polish stop property for the subsequent epi semiconductor polish step. In various embodiments, the second oxide layer 292 is formed to a thickness of approximately 100-300 Angstroms, and more preferably approximately 190-210 Angstroms, though any desired thickness may be used. The second oxide layer 292 may be formed by using a low pressure chemical vapor deposition (LPCVD) process to deposit a layer of tetraethyl ortho-silicate (TEOS) or some other conformal oxide layer over the first oxide layer 291, which is then densified with a heating or anneal step. However, it will be appreciated that the second oxide layer 292 may be formed using any desired technique. Alternatively, the first oxide layer 291 may be thermally grown from the SOI semiconductor layer 290 to the predetermined thickness that provides the required polish stop function or property, thereby eliminating the need to deposit a second oxide layer 292.

Figure 11:
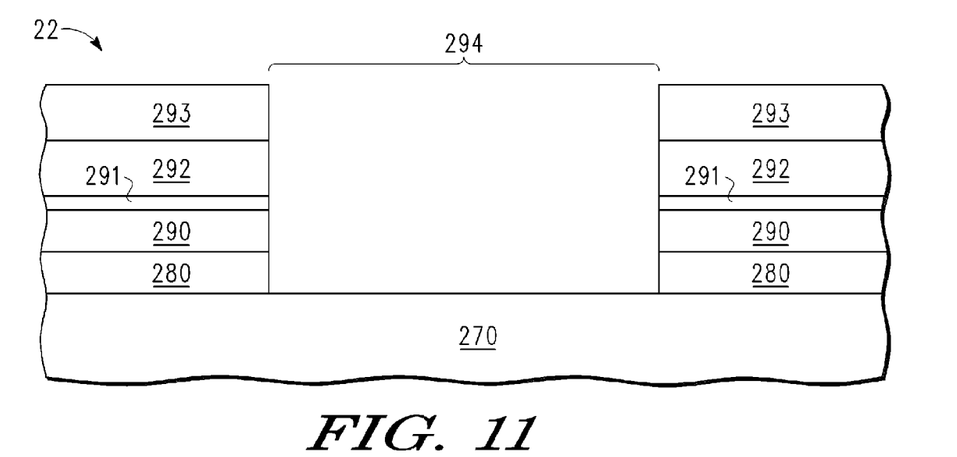
FIG. 11 illustrates processing subsequent to FIG. 10 where a patterned nitride mask layer is used to etch or remove portions of the SOI layers to form a first opening to expose a portion of the underlying substrate.

FIG. 11 illustrates processing of a semiconductor wafer structure 22 subsequent to FIG. 10 where a patterned nitride mask layer 293 is used to etch or remove portions of the SOI semiconductor layer 290 and buried insulator layer 280 to form a first opening 294 to expose a portion of the underlying substrate 270. As will be appreciated, any desired patterning and anisotropic etching techniques may be used to form an opening 294, such as patterning the nitride hardmask layer 293 using a photo resist mask layer (not shown), and then using the patterned nitride hardmask layer 293 to selectively remove or etch the exposed portions of the underlying oxide layers 291, 292 and semiconductor-on-insulator (SOI) layers 280, 290. Note that a portion of layer 293 may be etched away during this step.

Figure 12:
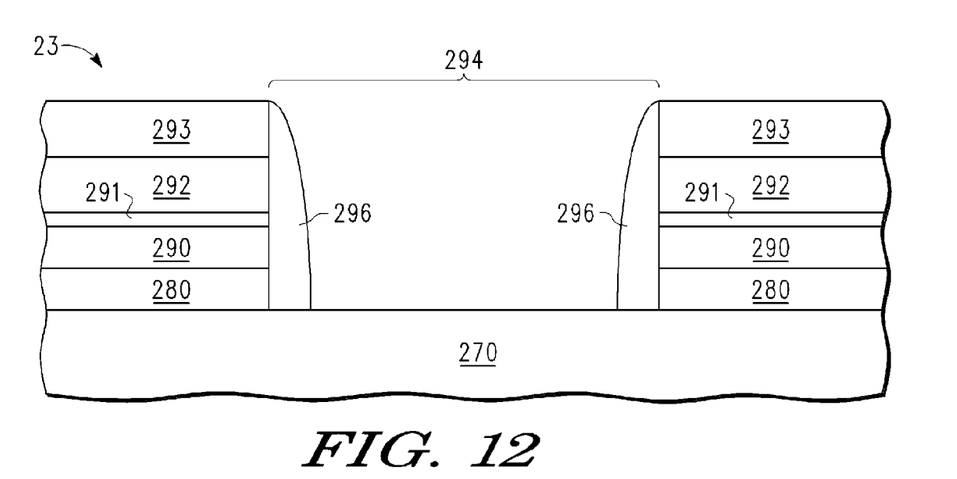
FIG. 12 illustrates processing subsequent to FIG. 11 after sidewall spacers are formed on the vertical surfaces of the first opening.

FIG. 12 illustrates processing of a semiconductor wafer structure 23 subsequent to FIG. 11 after sidewall spacers 296 are formed on the vertical surfaces of the first opening 294. As illustrated, the sidewall spacers 296 may be formed by depositing a dielectric layer (e.g., silicon dioxide or silicon nitride or any other dielectric) over the wafer structure 23 and then anisotropically etching the dielectric layer so that spacers 296 remain on the sides of the trench opening 294, but leave exposed a portion of the underlying semiconductor substrate layer 270. The sidewall spacers 296 are formed to avoid epitaxial growth from layer 290.

Figure 13:
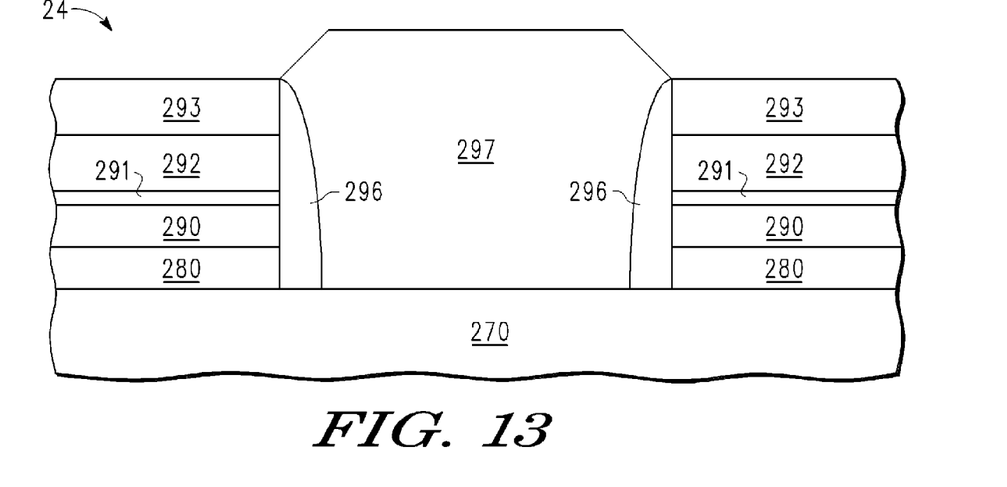
FIG. 13 illustrates processing subsequent to FIG. 12 after an epitaxial semiconductor layer is selectively formed to partially or completely fill the first opening.

With the sidewall spacers 296 in place, epitaxial silicon 297 can be grown from the substrate 270 in the trench opening 294 from the bottom up, as depicted in FIG. 13, which illustrates processing of a semiconductor wafer structure 24 subsequent to FIG. 12 after an epitaxial semiconductor layer 297 is selectively formed to partially or completely fill the first opening 294. As explained above, by selectively forming the epi semiconductor layer 297 so that its crystallographic orientation matches the orientation of the substrate semiconductor layer 270 but may differ from the crystallographic orientation of the SOI semiconductor layer 290, the mobility of the holes and electrons for subsequently formed PMOS and NMOS devices may be optimized.

Figure 14:
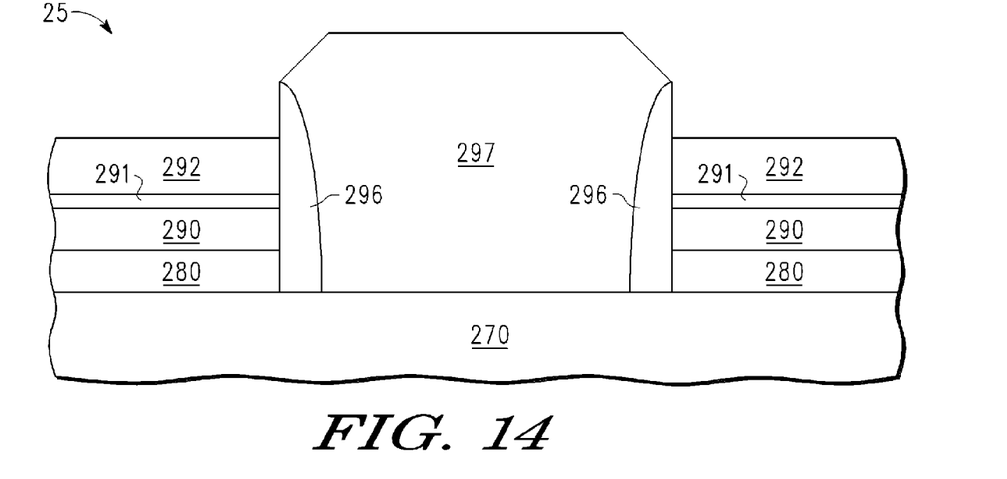
FIG. 14 illustrates processing subsequent to FIG. 13 after the patterned nitride mask layer is removed.

FIG. 14 illustrates processing of a semiconductor wafer structure 25 subsequent to FIG. 13 after the patterned nitride mask layer 293 is stripped or removed. As will be appreciated, the patterned nitride mask layer 293 may be removed using any desired silicon nitride etch chemistry, such as a hot phosphoric acid ($H_3PO_4$) solution. However, depending on the selectivity of the etch chemistry and the material used to form the sidewall spacers 296, the removal of the patterned nitride mask layer 293 may also remove part of the sidewall spacers 296. Once the patterned nitride mask layer 293 is removed, the underlying oxide layer 292 is exposed for use as a polish stop layer during silicon polishing of the wafer structure.

Figure 15:
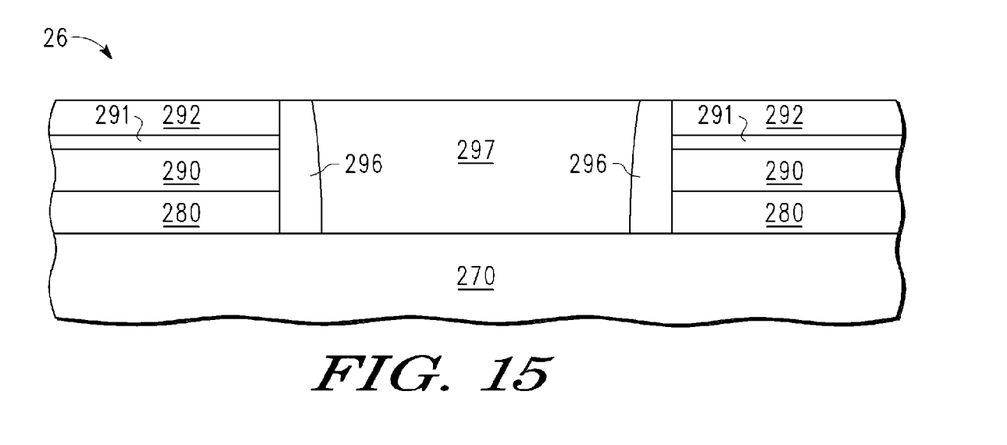
FIG. 15 illustrates processing subsequent to FIG. 14 after CMP polishing of the semiconductor wafer structure.

This is illustrated in FIG. 15, which depicts processing of a semiconductor wafer structure 26 subsequent to FIG. 14 after a polish and/or etch of the epitaxial semiconductor layer 297. Chemical mechanical polishing or any desired etchant process may be used to polish epi semiconductor layer 297, including dry etching, wet etching or oxidation of silicon and then stripping away the oxide. For example, after stripping the second patterned mask layer 293, a silicon CMP process may be applied to planarize the epitaxial semiconductor layer 297 using the oxide layer 292 as a CMP polish stop layer. During the CMP polish process, all or part of the polish stop layer 292 may be removed. The resulting wafer structure 26 includes the remnant sidewall spacers 296 that are positioned between the SOI semiconductor layer 290 and the polished epitaxial semiconductor layer 297, but isolation regions have not yet been formed. The wafer structure 26 may be cleaned with a hot phosphoric acid ($H_3PO_4$) solution, and then a second touch-up CMP polish may be applied to buff the epi semiconductor layer 297.

Figure 16:
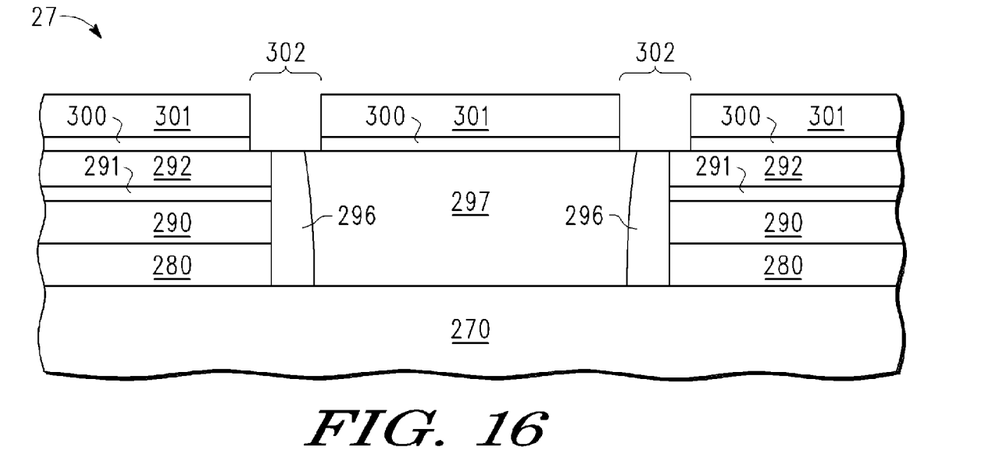
FIG. 16 illustrates processing subsequent to FIG. 15 after formation of a patterned pad oxide and nitride hardmask layer over the semiconductor wafer structure.

The formation of isolation regions is shown beginning with FIG. 16, which illustrates processing of a semiconductor wafer structure 27 subsequent to FIG. 15 after formation of a patterned pad oxide layer 300 and nitride hardmask layer 301 over the semiconductor wafer structure 27 to define STI etch regions 302. As depicted, the STI etch regions 302 define the location where the STI regions will subsequently be formed after selective removal of the exposed oxide polish stop layer 292, sacrificial oxide layer 291, SOI semiconductor layer 290, remnant sidewall spacers 296 and epitaxial semiconductor layer 297. The STI etch regions 302 may be formed using any desired selective etch process. For example, a pattern transfer and etching process may be applied with one or more etching steps to selectively remove the unprotected portions of the nitride hardmask layer 301 and pad oxide layer 300, including a dry etching process such as reactive-ion etching, ion beam etching, plasma etching or laser etching, a wet etching process wherein a chemical etchant is employed or any combination thereof. As depicted, the STI etch regions 302 are positioned to overlay the interface regions between the SOI semiconductor layer 290 and the epitaxial semiconductor layer 297, which also includes the sidewall spacers 296. As a result of using oxide to form the sidewall spacers 296, a conventional STI etch process may be used which is selective to silicon nitride since the STI etch process need only remove silicon (from the underlying SOI layer 290 and epi layer 296) and silicon dioxide (from the sidewall spacers 296 and part of layer 280 if desired). By so positioning the STI etch regions 302, the STI etch process completely removes the sidewall spacers 296.

Figure 17:
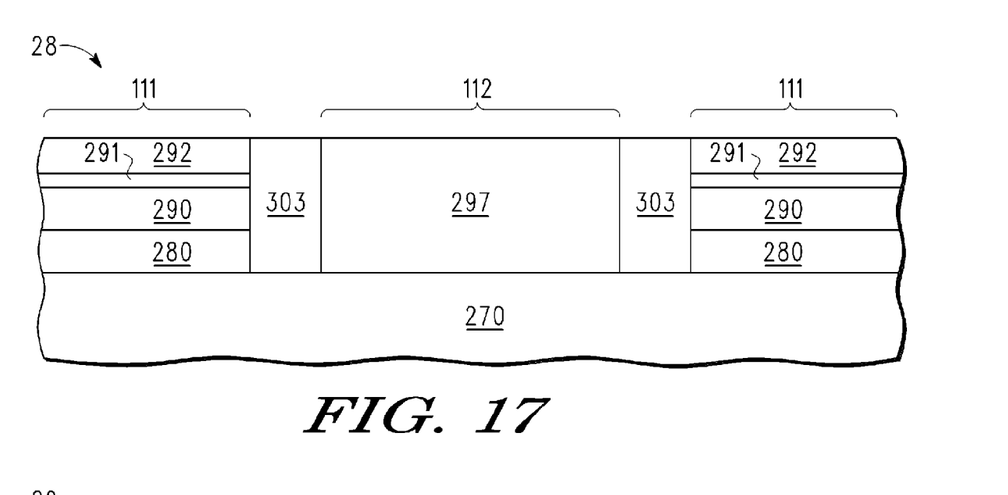
FIG. 17 illustrates processing subsequent to FIG. 16 after STI regions are formed in the etch regions defined by the patterned pad oxide and nitride hardmask layers.

FIG. 17 illustrates processing of a semiconductor wafer structure 28 subsequent to FIG. 16 after formation of STI regions 303 are formed in the etch regions 302 defined by the patterned pad oxide and nitride hardmask layers 300, 301. As formed, the STI regions 303 provide electrical and physical isolation between transistor devices in the first semiconductor active device region 112 and transistor devices in the second semiconductor active device region 111. It will be appreciated that isolation regions 303 may also be formed as field oxide regions or isolation dielectric trenches using any desired process. For example, STI regions 303 comprised of a silicon-oxide (or other dielectric) compound may be formed by defining trench areas (e.g., STI etch regions 302) with mask and patterning steps, etching trenches in selected portions of the layers 292, 291, 290, 280, 296 and 297 with an anisotropic STI etch process, filling the trenches with a deposited dielectric (such as high density plasma oxide), and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer structure is thermally oxidized to form the isolation dielectric. Though the STI regions 303 are shown as extending down to the underlying substrate layer 270, it will be appreciated that the STI regions 303 may instead be formed to extend down to the buried oxide layer 280 and still provide the requisite isolation function.

Figure 18:
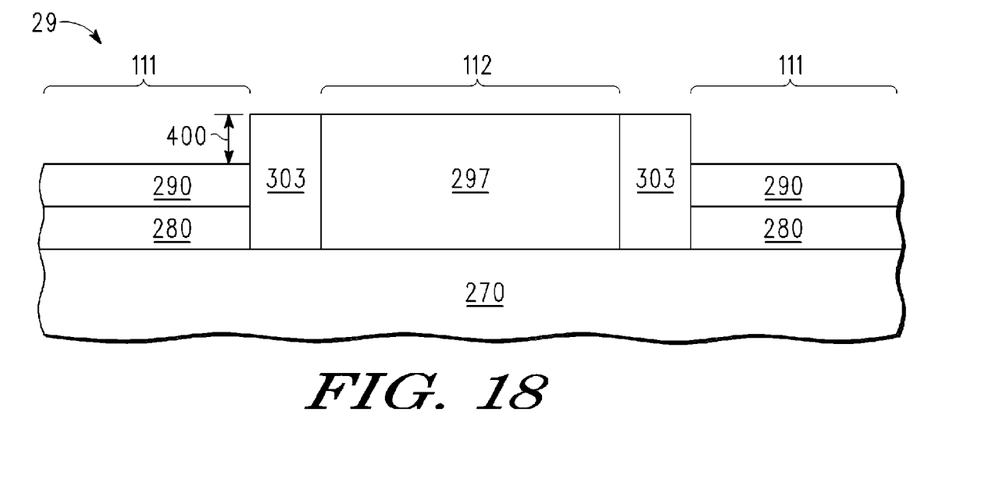
FIG. 18 illustrates processing subsequent to FIG. 9 or 17 after the remaining an oxide polish stop layer is removed.

FIG. 18 illustrates processing of a semiconductor wafer structure 29 subsequent to FIG. 9 or 17 after the remaining an oxide polish stop layer 92, 292 and any underlying pad oxide 91, 291 are removed. While any appropriate oxide etch process may be used, in selected embodiments, the oxide layer(s) may be removed by applying a wet hydrofluoric acid solution. As illustrated, the upper surface of the polished epi semiconductor layer 297 is higher than the underlying SOI layer 290 by a step height 400 which is exaggerated in FIG. 18. In this way, reduced step heights of less than approximately 200 Angstroms are obtained, though smaller etch heights may be obtained by reducing the thickness of the oxide polish stop layer 292. In accordance with various embodiments, the step height between the polished epi semiconductor layer 297 and the underlying SOI layer 290 is nearly zero, or is in fact, for all practical purposes zero. The resulting dual substrate structure 29 has a substantially coplanar surface to facilitate CMOS processing.

Figure 19:
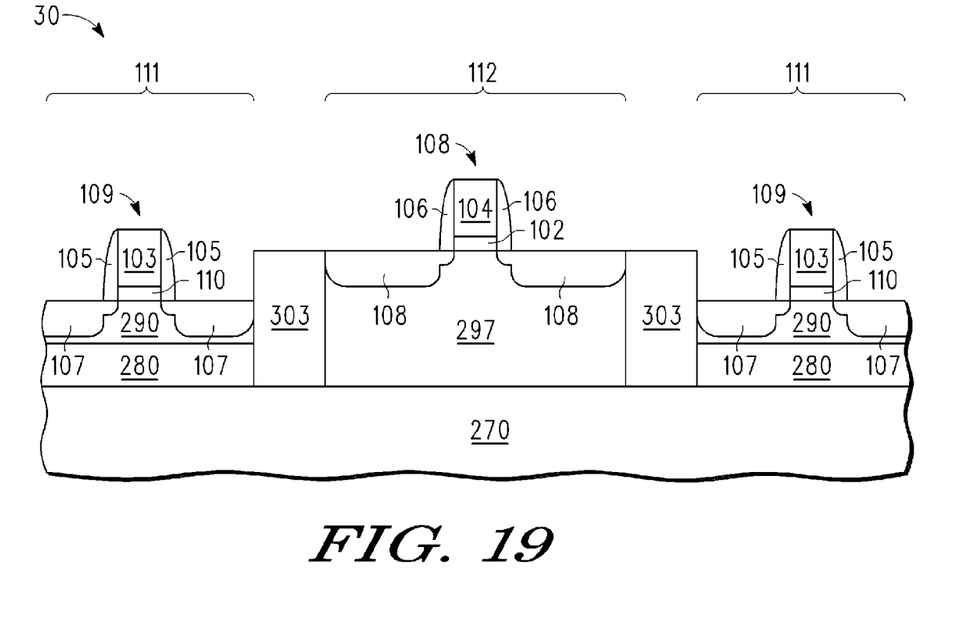
FIG. 19 illustrates processing subsequent to FIG. 18 after first and second semiconductor devices are formed.

FIG. 19 illustrates processing of the semiconductor wafer structure 30 subsequent to FIG. 18 after first and second semiconductor devices 108, 109 are formed. While other device structures may be used in connection with the planarized dual substrate wafer described herein, the example of FIG. 19 depicts transistor device structures formed from a gate dielectric material (such as silicon dioxide) and gate structures (such as polysilicon gates). In the implementation depicted in FIG. 19, PMOS and NMOS devices may be formed on the exposed semiconductor layers (i.e., the first and second semiconductor layers 297, 290), which may include well and body regions (not shown). Specifically, a first semiconductor device 108 is an NMOS device formed on a portion of the first epitaxial semiconductor layer 297, and a second semiconductor device 109 is a PMOS device formed on a portion of the second semiconductor layer 290. Alternatively, the first semiconductor device 108 may be a PMOS device and the second semiconductor device 109 may be an NMOS device. Both NMOS and PMOS devices can be fabricated on either layer 290 or 297. The allocation of device types to device regions may exploit the differing crystal orientation of the underlying layers 297, 290 to provide a high performance CMOS device where the PMOS device has improved hole mobility. This may be accomplished, for example, by forming the PMOS devices over the semiconductor material that has a (110) or (100) orientation, whereas the NMOS devices are formed over a semiconductor surface having a (100) or (110) orientation. In addition, the hole mobility of the PMOS devices may be further improved by forming the PMOS gate dielectrics and electrodes over a layer of compressed silicon germanium having a (110) orientation. The electron mobility of the NMOS devices may be further improved by forming the NMOS gate dielectrics and electrodes over a layer of tensile silicon having a (100) orientation.

In the example depicted in FIG. 19, the depicted wafer structure 30 includes a first epitaxial semiconductor layer 297—in which may be formed a body region (not shown)—and a second semiconductor layer 290—in which may be formed a well region (not shown)—that are laterally displaced and isolated with respect to one another by shallow trench isolation regions 303. However, it will be appreciated that either or both of the first and second semiconductor layers 297, 290 may be formed in whole or in part with epitaxially grown semiconductor material. The body and well regions contain impurities such that one is a p-doped and one is an n-doped. In the described embodiment, the body in the first epi layer 297 is a p-doped in which NMOS transistors are formed, and the well in the second semiconductor layer 290 is an n-doped in which PMOS transistors are formed.

Following the formation of wells and isolation trenches, at least a first gate dielectric layer is blanket deposited and/or grown across the entire wafer structure 30 and used to subsequently form the gate dielectric layers 101, 102. The first gate dielectric layer may be used to form at least part of the gate dielectric for all transistors on the wafer, or alternatively, the first gate dielectric layer may be used for only a first type of transistor formed on the wafer. In the depicted embodiment, the first gate dielectric layer may formed from a dielectric (e.g., silicon dioxide, a metal oxide or a relatively high-k dielectric material) that is formed by oxidation, chemical vapor deposition, or by atomic layer deposition having a typical final thickness that is in the range of 0.1-10 nanometers.

After forming the first gate dielectric layer, one or more first gate electrodes 103, 104 are formed on the first gate dielectric layer above first and second semiconductor layers 297, 290 using any desired gate electrode formation sequence. For example, the gate electrodes 103, 104 may be formed from at least a first conductive layer (e.g., polysilicon, SiGe and/or metal) by depositing or forming a first conductive layer having a thickness in the range of 1-200 nanometers over the gate dielectric layer to form a first gate stack. Once the first gate stack is formed, any desired gate electrode etch processing steps may be used to form the desired gate electrode 103, 104 over the first gate dielectric layer.

With the etched gate electrodes 103, 104 in place, one or more sidewall spacers 105, 106 may be formed on the sides of the gate electrodes 103, 104 by growing and/or depositing a spacer layer over the wafer structure 30 and then anisotropically etching the spacer layer (and any exposed first gate dielectric layer) down to the respective semiconductor substrate layers 297, 290. With the spacers in place, source/drain regions may be formed in the semiconductor substrate layers 297, 290 using any desired implantation sequence. For example, the gate electrodes 104 in the first active device region 112 may be masked so that the source/drain regions 107 in the second active device region 111 may be formed by implanting dopants into the exposed regions of the second semiconductor substrate 290. As will be appreciated, the dopants may be implanted into source/drain regions 107 around the gate electrode 103 prior to forming sidewall spacers 105 and/or after forming sidewall spacers 105. In similar fashion, the gate electrodes 103 in the second active device region 111 may be masked so that the source/drain regions 108 in the first active device region 112 may be formed by implanting dopants into the exposed regions of the epi semiconductor substrate 297, again by implanting dopants around the gate electrodes 104 and/or by first forming sidewall spacers 106 on the sides of the gate electrodes 104 and then implanting the source/drain regions 108.

It will be appreciated that additional processing steps will be used to complete the fabrication of first and second gate electrodes into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form there is provided herein a method for fabricating a dual surface semiconductor structure by providing or forming a first semiconductor layer having a first crystal orientation, and a second semiconductor layer (e.g., (100) p-type silicon or (110) p-type silicon), where the second semiconductor layer has a second crystal orientation and where the second semiconductor layer is separated from the first semiconductor layer by a buried insulator layer (e.g., an oxide layer). Over the second semiconductor layer, a first oxide layer is formed, such as by using a LPCVD process to deposit a TEOS which may densified with an anneal process. And over the first oxide layer, a nitride mask layer is formed over the first oxide layer. A trench opening is formed to expose the first semiconductor layer in a first predetermined region by selectively removing a portion of the nitride mask layer, first oxide layer, second semiconductor layer and buried insulator in the first predetermined region so as to leave a remaining portion of the nitride mask layer, first oxide layer, second semiconductor layer and buried insulator in a second predetermined region. In selected embodiments, the trench opening is formed by using a patterned nitride mask layer, which defines a first opening over the first oxide layer, to selectively remove at least a portion of the first oxide layer and second semiconductor layer, thereby forming a first trench which is then filled with a planarized dielectric material to form a shallow trench isolation region. Subsequently, a second patterned nitride mask layer is formed over the shallow trench isolation region to define a second opening which is used to selectively remove a portion of the shallow trench isolation region to expose the first semiconductor layer in the first predetermined region. In other embodiments, the trench opening is formed by using a patterned nitride mask layer, which defines a first opening over the first oxide layer, to selectively remove a portion of the first oxide layer, second semiconductor layer and buried insulator layer, thereby forming a first trench that exposes the first semiconductor layer. On the bottom and sides of the first trench, a dielectric layer is deposited and then anisotropically etched to form sidewall spacers on the sides of the first trench and to expose the first semiconductor layer in the first predetermined region. The trench opening is filled at least part by epitaxially growing a first epitaxial semiconductor material on at least an exposed surface of the first semiconductor layer (e.g., (110) n-type silicon or (100) n-type silicon), such as by selectively growing silicon, to form a first epitaxial semiconductor layer in the trench opening that has a third crystal orientation that is the same as the first crystal orientation. After the epitaxial growth step, the remaining portion of the nitride mask layer is removed or stripped to thereby expose the first oxide layer, and this oxide layer is used as a polish stop layer during polishing of the first epitaxial semiconductor layer (e.g., with a CMP step) so that the first epitaxial semiconductor layer is substantially coplanar with the second semiconductor layer. With the sidewall spacers in place, isolation regions may be formed after the epi polish step by forming a patterned nitride mask layer over the first epitaxial semiconductor layer and the second semiconductor layer having an opening over each sidewall spacer. Using the second patterned nitride mask layer, at least the sidewall spacer and part of the first epitaxial semiconductor layer and the second semiconductor layer may be selectively removed to form an isolation region trench which may be filled with a dielectric material. In addition, a first gate electrode structure (including a first relatively high-k dielectric gate layer and a first conductive layer) may be formed over the first epitaxial semiconductor silicon layer, while a second gate electrode structure (including a second relatively high-k dielectric gate layer and a second conductive layer) may be formed over the second semiconductor layer. As formed, the first gate electrode structure may be used to form a first transistor of a first conductivity type, while the second gate electrode structure may be used to form a second transistor of a second conductivity type that is different from the first transistor.

In another form, there is provided a method of forming an integrated circuit structure. As disclosed, first and second semiconductor layers are formed that are electrically isolated from each other by a buried insulator layer formed therebetween, where the first semiconductor layer has a first crystallographic orientation and where the second semiconductor layer has a second crystallographic orientation. In various embodiments, the first and second crystallographic orientations may be the same or different from one another. Over the second semiconductor layer, an oxide polish stop layer (such as a densified TEOS layer) is deposited, followed by the deposition of a hardmask layer (e.g., an ARC or silicon nitride layer) over the oxide polish stop layer. Subsequently, a portion of the hardmask layer, the oxide polish stop layer, the second semiconductor layer and the buried insulator layer are selectively removed to form a trench opening that exposes a surface portion of the first semiconductor layer. In selected embodiments, the layers may be selectively removed by patterning the hardmask layer to define a first opening over the layers; using the patterned hardmask layer to selectively remove a portion of the layers to form a first trench that exposes the first semiconductor layer; depositing a dielectric layer on at least the bottom and sides of the first trench; and anisotropically etching the dielectric layer to form sidewall spacers on the sides of the first trench and to form the trench opening to expose the surface portion of the first semiconductor layer. In other embodiments, the layers may be selectively removed by patterning the hardmask layer to define a first opening over the layers; using the patterned hardmask layer to selectively remove a portion of the layers, thereby forming a first trench that exposes the first semiconductor layer; depositing and planarizing a dielectric layer to fill the first trench with a dielectric material to form a shallow trench isolation region; forming a patterned mask layer over at least the shallow trench isolation region to define a second opening over the shallow trench isolation region; and using the patterned mask layer to selectively remove a portion of the shallow trench isolation region to form the trench opening to expose the surface portion of the first semiconductor layer. In forming the trench opening, remnant portion of the second semiconductor layer remains that is separated from the first semiconductor layer by one or more insulator layers. In the trench opening, a first epitaxial semiconductor material is epitaxially grown on an exposed surface portion of the first semiconductor layer to form a first epitaxial semiconductor layer that is above the second semiconductor layer, thereby at least substantially filling the trench opening, where the first epitaxial semiconductor layer has a crystal orientation that is the same as the first crystal orientation. After removing the remaining portion of the hardmask layer, the exposed oxide polish stop layer is used as a polish stop layer to polish the first epitaxial semiconductor layer (e.g., with a CMP process) so that the first epitaxial semiconductor layer is substantially coplanar with the second semiconductor layer.

In yet another form, there is provided a method and system for fabricating FET devices on dual substrates. First, a semiconductor wafer structure is provided in which a relatively thick mask layer is formed over a relatively thin oxide layer, an SOI semiconductor layer and an underlying first semiconductor layer, where the SOI semiconductor layer and first semiconductor layer are separated by an insulator layer. By exposing the first semiconductor layer in a first area, a trench opening in the semiconductor wafer structure is formed, thereby leaving a remnant portion of the SOI semiconductor layer that is separated from the first semiconductor layer by one or more insulator layers. In the trench opening, an epitaxial semiconductor material is selectively grown to fill at least part of the trench opening so that the trench opening is filled at least in part with a first epi layer. Subsequently, the remaining portion of the relatively thick mask layer is removed to thereby expose the relatively thin oxide layer, and the first epi layer and the SOI semiconductor layer are planarized to be substantially coplanar. On the planarized first epi layer and SOI semiconductor layer, FET devices may then be formed.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 19 is for first well (not shown) in the epi semiconductor substrate layer 297 to be an n-doped well and the second well (not shown) in the second semiconductor layer 290 to be p-doped. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes reduces the step height between dual substrates by using an oxide layer as CMP stop layer while polishing the epi semiconductor layers, thereby promoting Dual-Surface Orientation (DSO) and Bulk on SOI integration while reducing or eliminating the process and performance limitations associated with conventional fabrication techniques. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure, comprising:
   providing a first semiconductor layer having a first crystal orientation and a second semiconductor layer over at least part of the first semiconductor layer, where the second semiconductor layer has a second crystal orientation and where the second semiconductor layer is separated from the first semiconductor layer by an insulator layer;
   forming a first oxide layer over the second semiconductor layer;
   forming a mask layer over the first oxide layer;
   forming a trench opening by selectively removing a portion of the mask layer, first oxide layer, second semiconductor layer and insulator layer to expose the first semiconductor layer in a first region and to leave a remaining portion of the mask layer, first oxide layer, second semiconductor layer and an insulator layer in a second region;
   filling at least part of the trench opening by epitaxially growing a first epitaxial semiconductor material on at least an exposed surface of the first semiconductor layer to form a first epitaxial semiconductor layer in the trench opening that has a third crystal orientation that is the same as the first crystal orientation;
   removing the remaining portion of the mask layer before polishing the first epitaxial semiconductor layer; and
   polishing the first epitaxial semiconductor layer using the remaining portion of the first oxide layer as a polish stop layer so that the first epitaxial semiconductor layer is substantially coplanar with the second semiconductor layer.

2. The method of claim 1, where forming a trench opening comprises:
   patterning the mask layer to define a first opening over the first oxide layer;
   using the patterned mask layer to selectively remove at least a portion of the first oxide layer and second semiconductor layer, thereby forming a first trench;
   filling the first trench with a dielectric material;
   planarizing the dielectric material in the first trench to form a shallow trench isolation region;
   forming a second mask layer over at least the shallow trench isolation region;
   patterning the second mask layer to define a second opening over the shallow trench isolation region; and
   using the patterned second mask layer to selectively remove a portion of the shallow trench isolation region to expose the first semiconductor layer in the first region.

3. The method of claim 1, where forming a trench opening comprises:
   patterning the mask layer to define a first opening over the first oxide layer;
   using the patterned mask layer to selectively remove a portion of the first oxide layer, second semiconductor layer and insulator layer, thereby forming a first trench that exposes the first semiconductor layer;
   depositing a dielectric layer on at least the bottom and sides of the first trench; and
   anisotropically etching the dielectric layer to form sidewall spacers on the sides of the first trench and to expose the first semiconductor layer in the first region.

4. The method of claim 3, further comprising forming an isolation region after polishing the first epitaxial layer by:
   forming a second patterned mask layer over the first epitaxial semiconductor layer and the second semiconductor layer having an opening over each sidewall spacer;
   using the second patterned mask layer to selectively remove at least the sidewall spacer and part of the first epitaxial semiconductor layer and the second semiconductor layer, thereby forming an isolation region trench; and
   filling the isolation region trench with a dielectric material.

5. The method of claim 1, where polishing the first epitaxial semiconductor layer comprises a chemical mechanical polish step.

6. The method of claim 1, where the second semiconductor layer comprises (100) p-type silicon and the first semiconductor layer comprises (110) n-type silicon.

7. The method of claim 1, where the second semiconductor layer comprises (110) p-type silicon and the first semiconductor layer comprises (100) n-type silicon.

8. The method of claim 1, where forming a first oxide layer comprises using a low pressure chemical vapor deposition (LPCVD) process to deposit a layer of tetra-ethyl orthosilicate (TEOS).

9. The method of claim 8, further comprising densifying the first oxide layer with an anneal process.

10. The method of claim 1, where epitaxially growing the first epitaxial semiconductor material comprises a selective silicon growth step that fills the trench opening.

11. The method of claim 1, further comprising:
forming a first gate electrode structure over the first epitaxial semiconductor layer, said first gate electrode structure comprising at least a first dielectric gate layer and a first conductive layer; and
forming a second gate electrode structure over the second semiconductor layer, said second gate electrode structure comprising at least a second dielectric gate layer and a second conductive layer.

12. The method of claim 11, where the first gate electrode structure is used to form a first transistor of a first conductivity type, and the second gate electrode structure is used to form a second transistor of a second conductivity type that is different from the first transistor.

13. The method of claim 1, where removing the remaining portion of the mask layer exposes the first oxide layer.

14. A method of forming an integrated circuit structure, comprising:
forming first and second semiconductor layers that are electrically isolated from each other by a buried insulator layer located between the first and second semiconductor layers, where the first semiconductor layer has a first crystallographic orientation and where the second semiconductor layer has a second crystallographic orientation;
depositing a polish stop layer over the second semiconductor layer;
depositing a hardmask layer over the polish stop layer;
selectively removing a portion of the hardmask layer, the polish stop layer, the second semiconductor layer and the buried insulator layer to form a trench opening to expose a surface portion of the first semiconductor layer, thereby leaving a remnant portion of the second semiconductor layer that is separated from the first semiconductor layer by one or more insulator layers;
epitaxially growing a first epitaxial semiconductor material on at least an exposed surface portion of the first semiconductor layer to form a first epitaxial semiconductor layer that is above the second semiconductor layer, where the first epitaxial semiconductor layer has a crystal orientation that is the same as the first crystal orientation;
removing the remaining portion of the hardmask layer before polishing the first epitaxial semiconductor layer; and
polishing the first epitaxial semiconductor layer using the polish stop layer as a polish stop layer so that the first epitaxial semiconductor layer is substantially coplanar with the second semiconductor layer.

15. The method of claim 14, where depositing a hardmask layer comprises depositing an antireflective coating layer or a silicon nitride layer.

16. The method of claim 14, where depositing a polish stop layer comprises depositing a TEOS layer.

17. The method of claim 16, further comprising densifying the TEOS layer.

18. The method of claim 14, where selectively removing a portion of the hardmask layer, the polish stop layer, the second semiconductor layer and the buried insulator layer comprises:
patterning the hardmask layer to define a first opening over the polish stop layer;
using the patterned hardmask layer to selectively remove a portion of the polish stop layer, the second semiconductor layer and the buried insulator layer, thereby forming a first trench that exposes the first semiconductor layer;
depositing a dielectric layer on at least the bottom and sides of the first trench; and
anisotropically etching the dielectric layer to form sidewall spacers on the sides of the first trench and to form the trench opening to expose the surface portion of the first semiconductor layer.

19. The method of claim 14, where selectively removing a portion of the hardmask layer, the polish stop layer, the second semiconductor layer and the buried insulator layer comprises:
patterning the hardmask layer to define a first opening over the polish stop layer;
using the patterned hardmask layer to selectively remove a portion of the polish stop layer, the second semiconductor layer and the buried insulator layer, thereby forming a first trench that exposes the first semiconductor layer;
depositing a dielectric layer to fill the first trench with a dielectric material;
planarizing the dielectric material in the first trench to form a shallow trench isolation region;
forming a patterned mask layer over at least the shallow trench isolation region to define a second opening over the shallow trench isolation region; and
using the patterned mask layer to selectively remove a portion of the shallow trench isolation region to form the trench opening to expose the surface portion of the first semiconductor layer.

20. The method of claim 14, where the first and second crystallographic orientations have the same orientation.

21. The method of claim 14, further comprising:
forming a first gate electrode structure of a first conductivity type over the first epitaxial semiconductor layer; and
forming a second gate electrode structure of a second conductivity type over the second semiconductor layer, where the first conductivity type is different from the second conductivity type.

22. The method of claim 14, removing the remaining portion of the hardmask layer exposes the polish stop layer.

* * * * *